(12) United States Patent
Shintani

(10) Patent No.: US 8,139,139 B2
(45) Date of Patent: Mar. 20, 2012

(54) IMAGING APPARATUS WITH PHASE DIFFERENCE DETECTING SENSOR

(75) Inventor: Dai Shintani, Osaka (JP)

(73) Assignee: Panasonic Corporation, Osaka (JP)

( * ) Notice: Subject to any disclaimer, the term of this patent is extended or adjusted under 35 U.S.C. 154(b) by 440 days.

(21) Appl. No.: 12/400,303

(22) Filed: Mar. 9, 2009

(65) Prior Publication Data

US 2009/0322918 A1    Dec. 31, 2009

Related U.S. Application Data

(63) Continuation of application No. PCT/JP2008/002177, filed on Aug. 8, 2008.

(30) Foreign Application Priority Data

Aug. 13, 2007  (JP) ................................. 2007-211163

(51) Int. Cl.
*H04N 5/232* (2006.01)
*H04N 3/14* (2006.01)
*H01L 21/00* (2006.01)
*H01L 31/102* (2006.01)
*G02B 27/10* (2006.01)
*H01L 27/00* (2006.01)
*G03B 17/00* (2006.01)

(52) U.S. Cl. .......... 348/345; 348/294; 438/57; 257/438; 359/621; 250/208.1; 396/79; 396/82

(58) Field of Classification Search .......... 348/345–356, 348/294; 359/621–923; 438/57–903; 396/79, 396/82; 257/458; 250/208.1

See application file for complete search history.

(56) References Cited

U.S. PATENT DOCUMENTS

| | | | | |
|---|---|---|---|---|
| 6,781,632 | B1 * | 8/2004 | Ide | 348/345 |
| 6,819,360 | B1 * | 11/2004 | Ide et al. | 348/340 |
| 7,468,289 | B2 * | 12/2008 | Maruyama et al. | 438/65 |
| 7,609,294 | B2 * | 10/2009 | Sugawara | 348/220.1 |
| 2003/0012568 | A1 * | 1/2003 | Ishikawa et al. | 396/104 |
| 2004/0125222 | A1 * | 7/2004 | Bradski et al. | 348/272 |
| 2011/0076001 | A1 * | 3/2011 | Iwasaki | 396/114 |

FOREIGN PATENT DOCUMENTS

| | | |
|---|---|---|
| JP | 64-062830 | 3/1989 |
| JP | 05-224118 | 9/1993 |
| JP | 11-337813 | 12/1999 |
| JP | 2000-156823 | 6/2000 |
| JP | 2000-292686 | 10/2000 |

(Continued)

OTHER PUBLICATIONS

International Search Report.

*Primary Examiner* — Lin Ye
*Assistant Examiner* — Marly Camargo
(74) *Attorney, Agent, or Firm* — Pearne & Gordon LLP

(57) ABSTRACT

An imaging apparatus having a function of enabling focus detection at high speed while exposing an image sensor to light. Imaging apparatus 1 has: a first photoelectric converting element (image sensor 10) that converts an optical image formed on an imaging plane into an electrical signal for forming an image signal; and a second photoelectric converting element (phase difference detecting sensor 20) that receives light having passed through the first photoelectric converting element and converts light into an electrical signal for distance measurement.

13 Claims, 9 Drawing Sheets

FOREIGN PATENT DOCUMENTS

| | | |
|---|---|---|
| JP | 2000-305010 | 11/2000 |
| JP | 2001-083407 | 3/2001 |
| JP | 2001-124984 | 5/2001 |
| JP | 2002-250860 | 9/2002 |
| JP | 2005-175976 | 6/2005 |
| JP | 2005175976 A * | 6/2005 |
| JP | 2006-270183 | 10/2006 |
| JP | 2007-135140 | 5/2007 |
| JP | 2007-163545 | 6/2007 |

* cited by examiner

IMAGING APPARATUS WITH PHASE DIFFERENCE DETECTING SENSOR

CROSS REFERENCE TO RELATED APPLICATIONS

This application claims the benefit of International Patent Application No. PCT/JP2008/002177, filed on Aug. 8, 2008, which is incorporated herein by reference in its entirety. International Patent Application No. PCT/JP2008/002177 is entitled to the benefit of Japanese Patent Application No. 2007-211163, filed on Aug. 13, 2007, which is incorporated herein by reference in its entirety.

BACKGROUND

1. Technical Field

The technical field relates to an imaging apparatus and a camera that include a function of enabling focus detection at high speed while exposing the image sensor to light.

2. Description of the Related Art

Recently, digital cameras for converting optical images into electrical signals using image sensors such as CCD (Charge Coupled Device) or CMOS (Complementary Metal-Oxide Semiconductor) sensors and digitizing and recording the resulting electrical signals, are becoming popular.

Single-lens reflex digital cameras include a phase difference detecting unit that detects phase differences and employs an auto focus function (AF function) based on a phase difference detecting scheme. According to the auto focus function based on a phase difference detecting scheme, the defocus direction and the degree of defocus can be detected, so that there are advantages of reducing the time to move the focus lens and adjusting focus at high speed. For example, see Patent Document 1 (Japanese Patent Application Laid-Open No. 2007-163545). To guide an optical image of the subject to the phase difference detecting unit, conventional single-lens reflex digital cameras are provided with movable mirrors that can be inserted on and evacuated from the optical path from the lens barrel to the image sensor.

To realize miniaturization of digital cameras, so-called compact digital cameras employ an auto focus function based on a video auto focus scheme (video AF scheme) using image sensors. See, for example, Patent Document 2 (Japanese Patent Application Laid-Open No. 2007-135140). Miniaturization of compact digital cameras is realized by removing mirrors. Further, compact digital cameras can operate the auto focus function while exposing the image sensors to light and shoot images while displaying images shot by the image sensor in the display section provided in the back of the camera. This auto focus function based on the video AF scheme provides an advantage that the precision is generally high compared to auto focus based on the phase difference detecting scheme.

However, with the single-lens reflex digital camera disclosed in Patent Document 1, movable mirrors that move from the lens barrel to the image sensor are inserted on the optical path to guide the optical image of the subject to the phase difference detecting unit. Therefore, it is not possible to use the phase difference detecting unit while the image sensor is exposed to light.

Further, the above video AF scheme used in the digital camera disclosed in Patent Document 2 cannot detect the defocus direction. For example, although, with the auto focus function based on a contrast scheme, a contrast peak is determined when focus is detected, the direction of the contrast peak, that is, the defocus direction cannot be detected unless the focus lens is moved forward and backward from the current position. Therefore, detecting focus at higher speed is limited to a certain extent.

SUMMARY

The object is to provide an imaging apparatus and a camera that include a function of enabling focus detection at high speed while exposing an image sensor to light.

The above object can be achieved by the following configuration.

The imaging apparatus employs a configuration including: a first photoelectric converting element that converts an optical image formed on an imaging plane into an electrical signal for forming an image signal; and a second photoelectric converting element that receives light having passed through the first photoelectric converting element and converts the light into an electric signal for distance measurement.

Further, the imaging apparatus includes: an image sensor that comprises a photoelectric converting section; and a phase difference detecting sensor that detects a phase difference, and employs a configuration where the phase difference detecting sensor receives light passed through the image sensor and detects the phase difference.

The camera employs a configuration having an imaging apparatus and a signal processing section, wherein the imaging apparatus includes: an image sensor that includes a photoelectric converting section which includes: a first photoelectric converting section; and a second photoelectric converting section which has a light transmittance higher than in the first photoelectric converting section; a phase difference detecting sensor that receives light passed through the image sensor and detects a phase difference; and a signal processing section that carries out different processings for an output from the second photoelectric converting section and for an output from the first photoelectric converting section.

Further, the camera employs a configuration including: an image sensor that comprises a photoelectric converting section comprising an amplifying section; and a phase difference detecting sensor that detects a phase difference, and employs a configuration where the phase difference detecting sensor receives light passed through the image sensor and detects the phase difference.

DETAILED DESCRIPTION OF THE PREFERRED EMBODIMENT

Hereinafter, embodiments of the present invention will be explained in detail with reference to the accompanying drawings.

Embodiment 1

[The Structure of the Imaging Apparatus]

Figure 1:
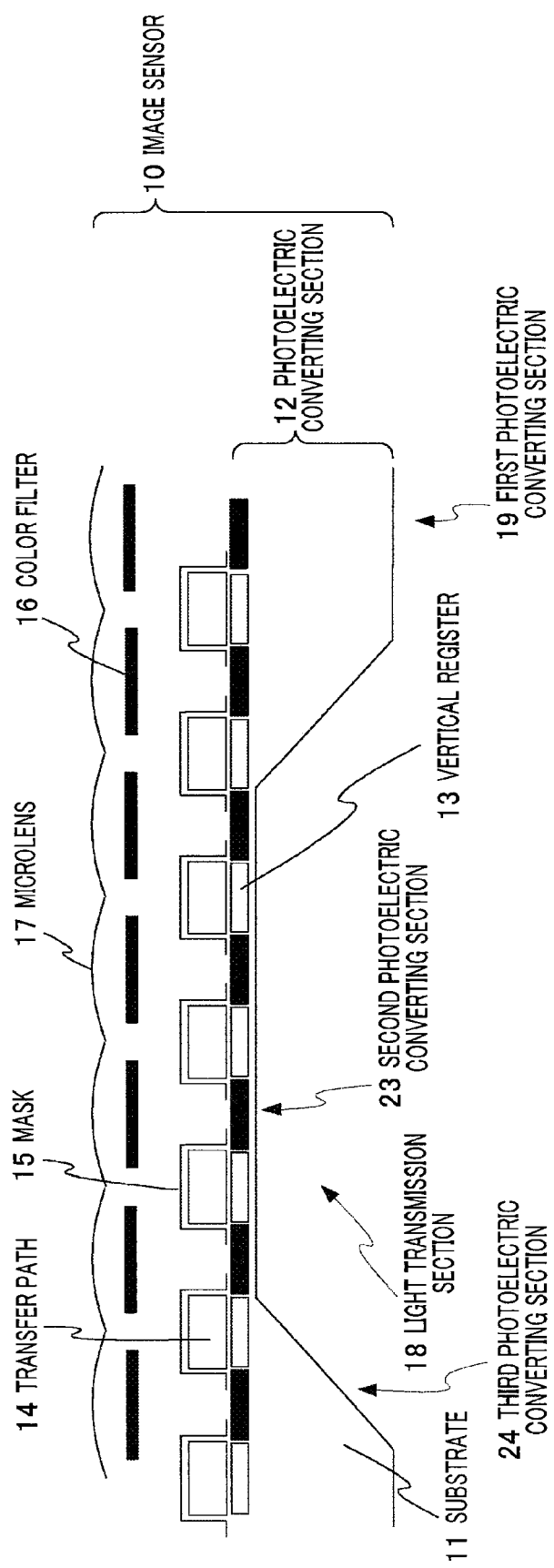
FIG. 1 shows a partly enlarged view of a cross-section of an image sensor included in an imaging apparatus according to Embodiment 1 of the present invention.
Figure 2:
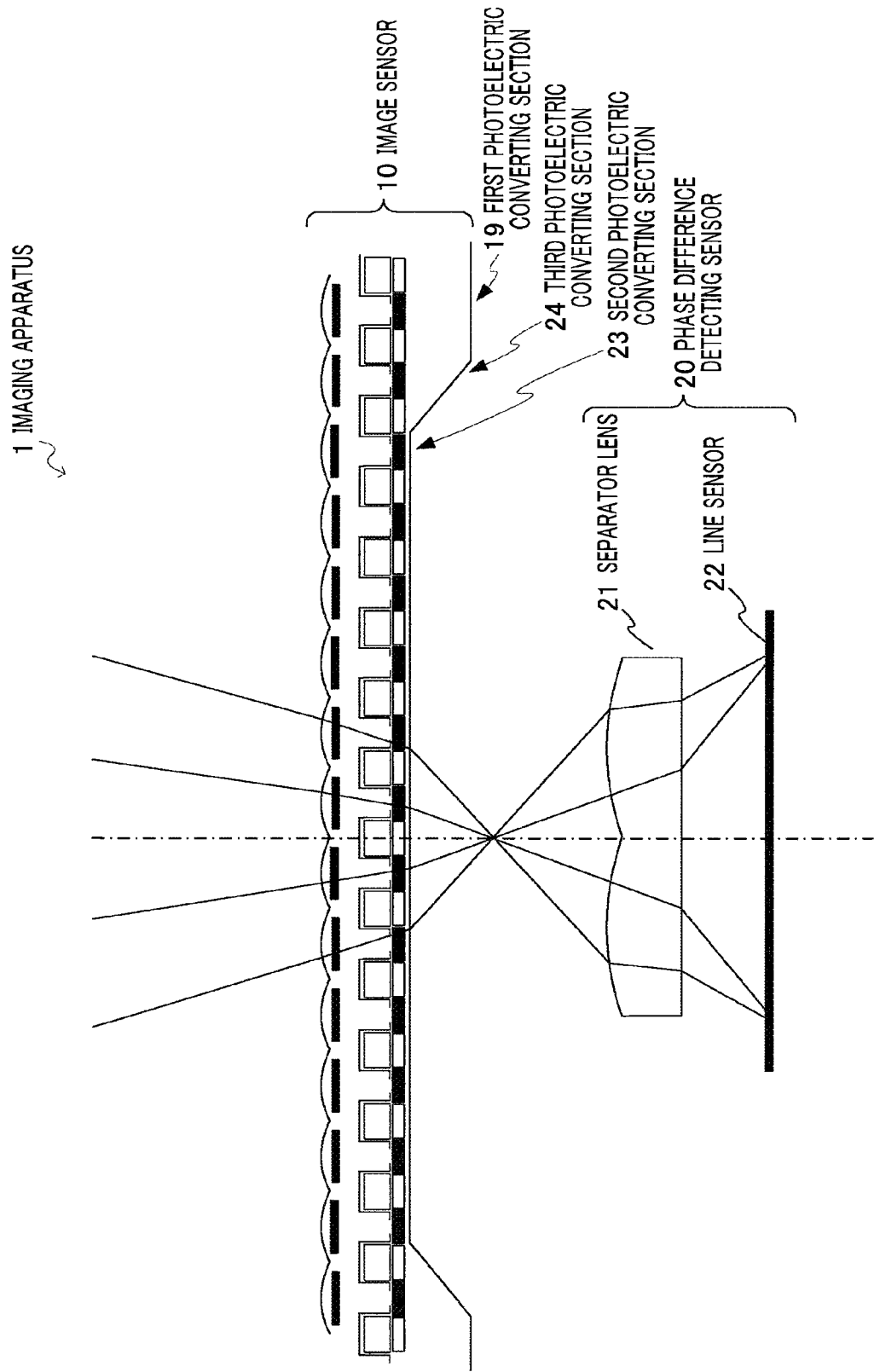
FIG. 2 shows a partly enlarged view of a cross-section of the imaging apparatus according to Embodiment 1 of the present invention.

FIG. 1 is a partly enlarged view of a cross-section of an image sensor included in an imaging apparatus according to Embodiment 1 of the present invention. FIG. 2 is a partly enlarged view of a cross-section of the imaging apparatus according to Embodiment 1 of the present invention. Imaging apparatus 1 shown in FIG. 2 has image sensor 10 shown in FIG. 1 and phase difference detecting unit 20 that includes a focus detecting mechanism based on the phase difference detecting scheme.

Image sensor 10 is made of a semiconductor material and is formed with photoelectric converting section 12 including substrate 11, vertical registers 13, transfer paths 14, masks 15, color filters 16 and microlenses 17. Photoelectric converting section 12 generates electric charge by absorbing light. Photoelectric converting section 12 employs a configuration of aligning light receiving sections (also referred to as "pixels") that receive light. Color filter 16 and microlens 17 are arranged to meet each pixel, respectively. Electric charge in each light receiving section is outputted as an electrical signal through vertical register 13 and transfer path 14. By acquiring information about the location and the electric charge of each light receiving section from the entire imaging plane of image sensor 10, image sensor 10 converts the optical image formed in the imaging plane into an electrical signal for forming an image signal. An Si (silicon) base is used for substrate 11. Note that image sensor 10 is an example of the first photoelectric converting element of the present invention.

With the present embodiment, photoelectric converting section 12 includes a concave part in part of substrate 11. The thickness of the concave part in substrate 11 in the optical axis direction is thinner than the other parts. The concave part of substrate 11 allows light to transmit. That is, the concave part in substrate 11 forms light transmission section 18. In this way, image sensor 10 is configured to allow light to transmit. Then, imaging apparatus 1 is configured to allow light having transmitted through light transmission section 18 of image sensor 10 to reach phase difference detecting sensor 20. Further, thanks to the above configuration, photoelectric converting section 12 includes first photoelectric converting section 19 which has a low light transmittance, and second photoelectric converting section 23 which is formed in light transmission section 18 and which has a light transmittance higher than in first photoelectric converting section 19. Further, third photoelectric converting section 24 is located in the intermediate area between first photoelectric converting section 19 and second photoelectric converting section 23. First photoelectric converting section 19, second photoelectric converting section 23 and third photoelectric converting section 24 will be explained later.

Here, the concave part in substrate 11 is formed by making part of the Si base thin by cutting, grinding or etching part of the Si base. For example, by making the thickness of the Si base 2 to 3 μm to form light transmission section 18, light transmits through photoelectric converting section 12. With the present embodiment, the concave part in substrate 11 has a thickness of about 3 μm in the optical axis direction, and allows 50% of near-infrared light to transmit. Generally, the Si base is formed with the thickness through which light from photoelectric converting section 12 hardly transmits to a photographer side. This is because, if light transmits to the photographer side, the amount of electric charge generated in photoelectric converting section 12 decreases and the output of an electrical signal decreases.

The sides of the concave part shown in FIG. 1 are formed at such angles that transmission light does not reflect upon phase difference detecting sensor 20. This is because, when light reflected through the side of the concave part is inputted to phase difference detecting sensor 20, an image is formed in phase difference detecting sensor 20, which is not the real image, and, therefore, phase difference detecting sensor 20 is likely to cause error detection.

Phase difference detecting sensor 20 is formed with separator lens 21 and line sensor 22. Phase difference detecting sensor 20 is arranged in the location to meet light transmission section 18. Phase difference detecting sensor 20 receives transmission light from image sensor 10 and detects the phase difference. Then, phase difference detecting sensor 20 converts the received transmission light into an electrical signal for distance measurement. Further, phase difference detecting sensor 20 is an example of the second photoelectric converting element of the present invention.

With the present embodiment, image sensor 10 has a plurality of light transmission sections 18. Then, phase difference detecting sensors 20 are each provided in the position to meet each light transmission section 18 to receive transmission light from each light transmission section 18.

When the subject image guided from the shooting lens (not shown) transmits through light transmission section 18 of image sensor 10 and is inputted in separator lens 21 of phase difference detecting sensor 20, the transmission light is pupil-split by separator lens 21 to form identical subject images on respective two parts on line sensor 22. When the distance to the subject changes while the focus distance of the camera lens is fixed, the interval between the two subject images on line sensor 22 changes. On phase difference detecting sensor 20, when focus is adjusted upon the subject, subject images are formed in predetermined positions on line sensor 22. At this point, when the subject images are formed in positions different from the predetermined positions on line sensor 22, phase difference detecting sensor 20 is able to detect the defocus direction and the degree of defocus.

Further, while maintaining the subject image incident upon photoelectric converting section 12, that is, while exposing image sensor 10 to light, imaging apparatus 1 is able to perform focus detection by phase difference detecting sensor 20 based on the phase difference detecting scheme. Further, accompanying this, (1) shooting images while image signals from image sensor 10 are displayed and (2) combining focus detection based on a phase difference detecting scheme and focus detection based on a contrast scheme, are possible.

Modification Examples

Although an example has been explained with the present embodiment where image sensor 10 allows light to transmit by making part of substrate 11 of photoelectric converting section 12 thin, the present invention is not limited to this. For example, as other methods of allowing light to transmit through the image sensor, light may be transmitted by making entire substrate 11 thin. Further, light may be transmitted by providing holes in part of substrate 11.

Embodiment 2

[The Structure of Another Imaging Apparatus]

Figure 3:
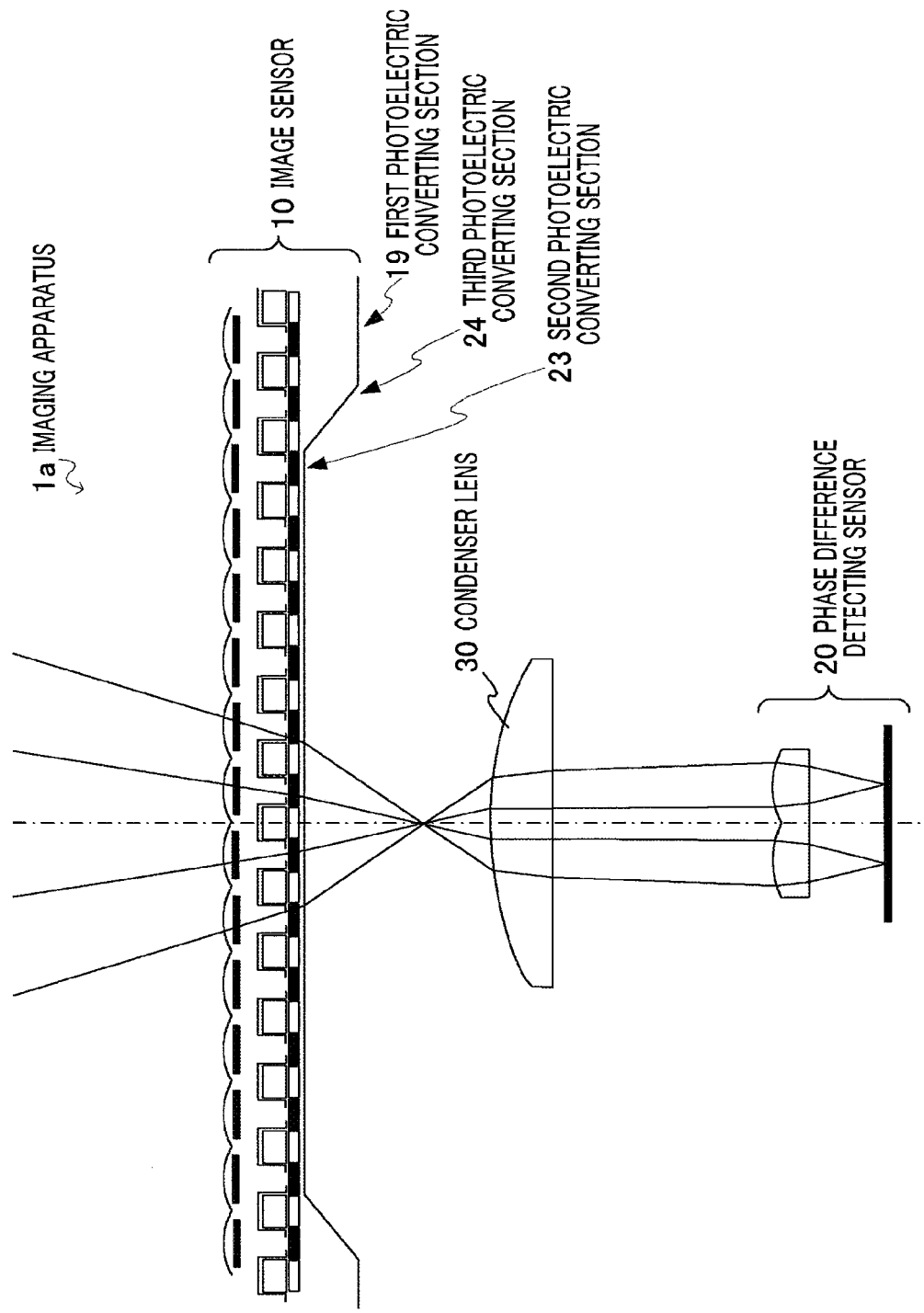
FIG. 3 shows a partly enlarged view of a cross-section of an imaging apparatus according to Embodiment 2 of the present invention.

FIG. 3 is a partly enlarged view of a cross-section of an imaging apparatus according to Embodiment 2 of the present invention. Imaging apparatus 1a shown in FIG. 3 employs a configuration of arranging condenser lens 30 between image sensor 10 and phase difference detecting sensor 20 corresponding to image sensor 10 and phase difference detecting sensor 20 of Embodiment 1 shown in FIG. 1 and FIG. 2.

The subject image guided from the shooting lens (not shown) transmits through photoelectric converting section 12 and is inputted in condenser lens 30, so that it is possible to make expanding subject images compact. Further, it is possible to make the incident angle with respect to separator lens 21 smaller and prevent the aberration (the shift from the ideal formed image) by means of separator lens 21. Further, the interval between the subject images on line sensor 22 can be shortened, so that it is possible to shorten the width of line sensor 22.

Further, by providing condenser lens 30, displacement of the pupil-split width on line sensor 22 becomes little with respect to defocus displacement, thereby enabling measurement for various replaceable lenses, from a point blank distance to an infinite long distance.

Further, if the pitches between pixels on line sensor 22 cannot be narrowed and the precision in distance measurement is poor, phase difference detection sensors for long focus distance and for short focus distance associated with condenser lenses 30 of different focus distances are provided in parallel, so that it is possible to switch between phase difference detection sensors for long focus distance and for short focus distance and secure the required precision in distance measurement. In other words, by providing phase difference detecting sensors associated with condenser lenses 30 of different focus distances, the pitches between pixels on line sensor 22 widen, so that advantages of higher sensitivity and reduction in cost can be expected.

Further, if there is no condenser lens 30 as shown in FIG. 2, displacement of the pupil-split width on line sensor 22 increases with respect to defocus displacement, thereby enabling super precise distance measurement near the position where focus is adjusted.

Embodiment 3

[An Application Example of the Imaging Apparatus]

Figure 4:
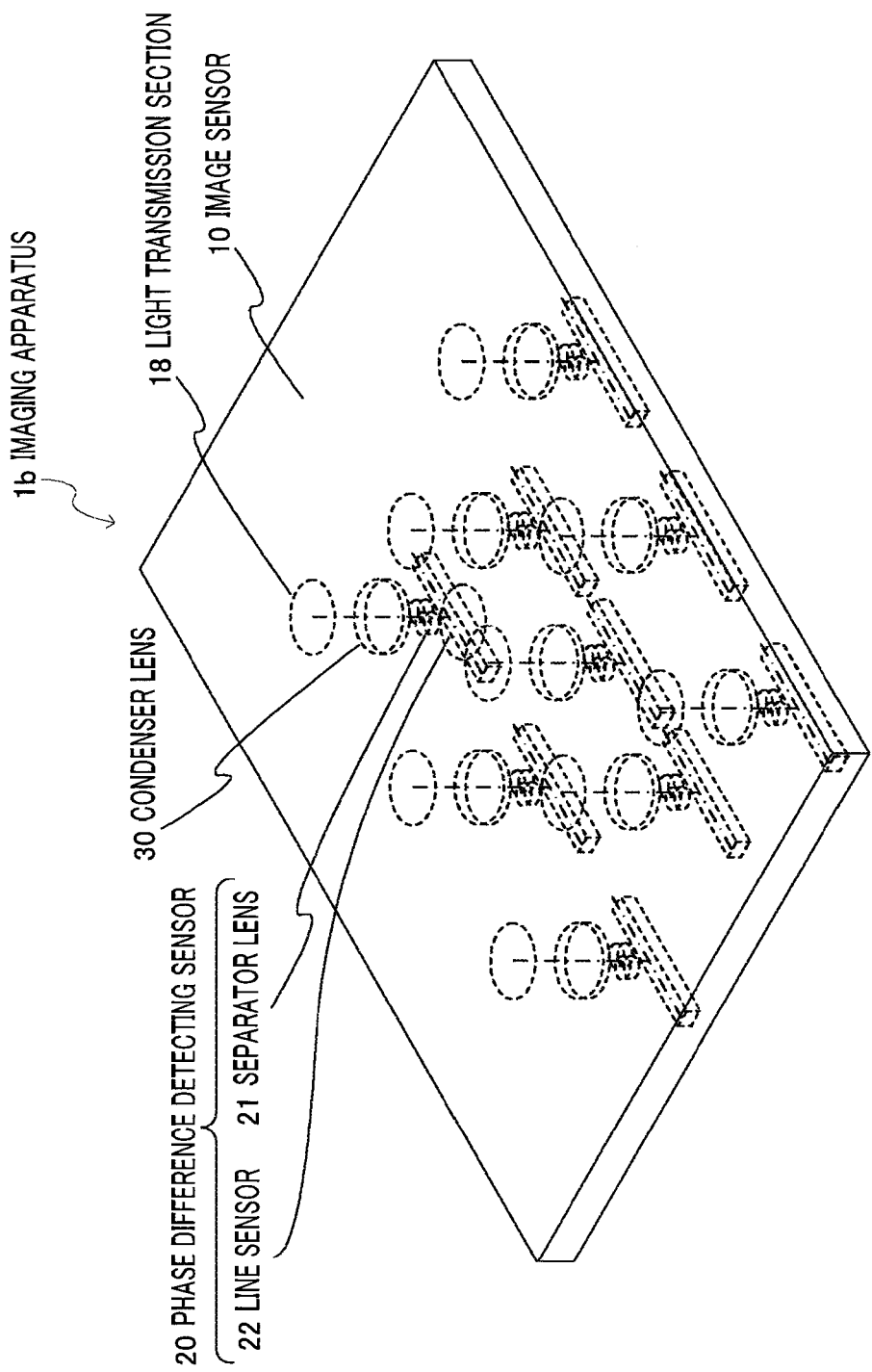
FIG. 4 is a perspective view of an imaging apparatus according to Embodiment 3 of the present invention.

FIG. 4 is a perspective view of an imaging apparatus according to Embodiment 3 of the present invention. In imaging apparatus 1b shown in FIG. 4, a plurality of selectable phase difference detecting sensors 20 each formed with separator lens 21 and line sensor 22 are arranged. As shown in FIG. 4, with the present embodiment, respective nine phase difference detecting sensors 20 are arranged on the imaging plane to meet light transmission sections 18. Nine phase difference detecting sensors 20 detect the phase differences between optical images formed in different positions on the imaging plane. That is, image sensor 10 includes a plurality of distance measurement points where phase difference detecting sensors 20 are arranged. According to the position where each phase difference detecting sensor 20 is arranged, each phase difference detecting sensor 20 outputs distance measurement data matching the positions of subject images formed on line sensor 22.

In case where this imaging apparatus 1b is mounted on a camera, the photographer is able to select random distance measurement points in the shooting frame. Further, on the camera side, it is possible to select the optimal distance measurement point according to an automatic optimization algorithm and adjust focus by automatically driving the focus lens based on distance measurement data outputted from phase difference detecting sensor 20 associated with the selected distance measurement point. It is possible to decrease the probability that pictures focused on the background are taken, by, for example, setting the automatic optimization algorithm such that the distance measurement point associated with distance measurement data closest to the camera, is selected from a plurality of items of distance measurement data.

Embodiment 4

[Output Correction in the Photoelectric Converting Element on the Light Transmission Section]

As shown in FIG. 1 and FIG. 2, photoelectric converting section 12 has first photoelectric converting section 19 which has a low light transmittance and second photoelectric converting section 23 which is formed in light transmission section 18 and which has a light transmittance higher than in first photoelectric converting section 19. Part of subject light transmits through second photoelectric converting section 23, and, therefore, the photoelectric conversion efficiency in second photoelectric converting section 23 becomes lower than in first photoelectric converting section 19. In this way, even if the same amount of light is received, the amount of electric charge accumulated in second photoelectric converting section 23 becomes lower than in first photoelectric converting section 19. Therefore, just making the electrical signal outputted from image sensor 10 subjected to conventional image processing, cannot rule out the possibility that part of the image from the portion to meet light transmission section 18 which is shot, becomes different from part of the image from the portion to meet first photoelectric converting section 19. For example, there is a possibility that part of the image from the portion to meet light transmission section 18 which is shot, becomes darker than part of the image from the portion to meet first photoelectric converting section 19.

Further, to what extent the output of second photoelectric converting section 23 decreases varies depending on the wavelength of light. This is because, when the wavelength is longer, the rate substrate 11 allows light to transmit is higher. Consequently, the amount of light having transmitted varies between color filters 16 formed to meet pixels due to the influence of the wavelength of light. Then, by varying the amount of correction per color according to the relationships shown below, it is possible to acquire a stable image output. Here, for example, amplification is used as the method of color correction.

(R-pixel correction amount in the second photoelectric converting section)−(R-pixel correction amount in the first photoelectric converting section)=Rk (G-pixel correction amount in the second photoelectric converting section)−(G-pixel correction amount in the first photoelectric converting section)=Gk (B-pixel correction amount in the second photoelectric converting section)−(B-pixel correction amount in the first photoelectric converting section)=Bk Rk>Gk>Bk The above relationships show the differences between the amounts of correction of pixels of red (R), green (G) and blue (B) in second photoelectric converting section 23 and the amounts of correction of pixels of RGB in first photoelectric converting section 19. Red has the longest wavelength in the three colors of red, green and blue and has the highest transmittance, and, therefore, the difference between the amounts of correction of the red pixels is the greatest. Further, blue has the shortest wavelength in the above three colors and has the lowest transmittance, and, therefore, the difference between the amounts of correction of the blue pixels is the smallest.

The amount of correction of an output from each pixel in photoelectric converting section 12 is determined based on whether or not the type of photoelectric converting section 12 is second photoelectric converting section 23 arranged in the location to meet light transmission section 18 and based on the color of color filter 16 arranged in the location to meet each pixel. Further, each amount of correction is determined such that the white balance and/or the brightness of images displayed based on the output from second photoelectric converting section 23 and the output from first photoelectric converting section 19, become equal.

<CMOS Sensor>

Figure 5:
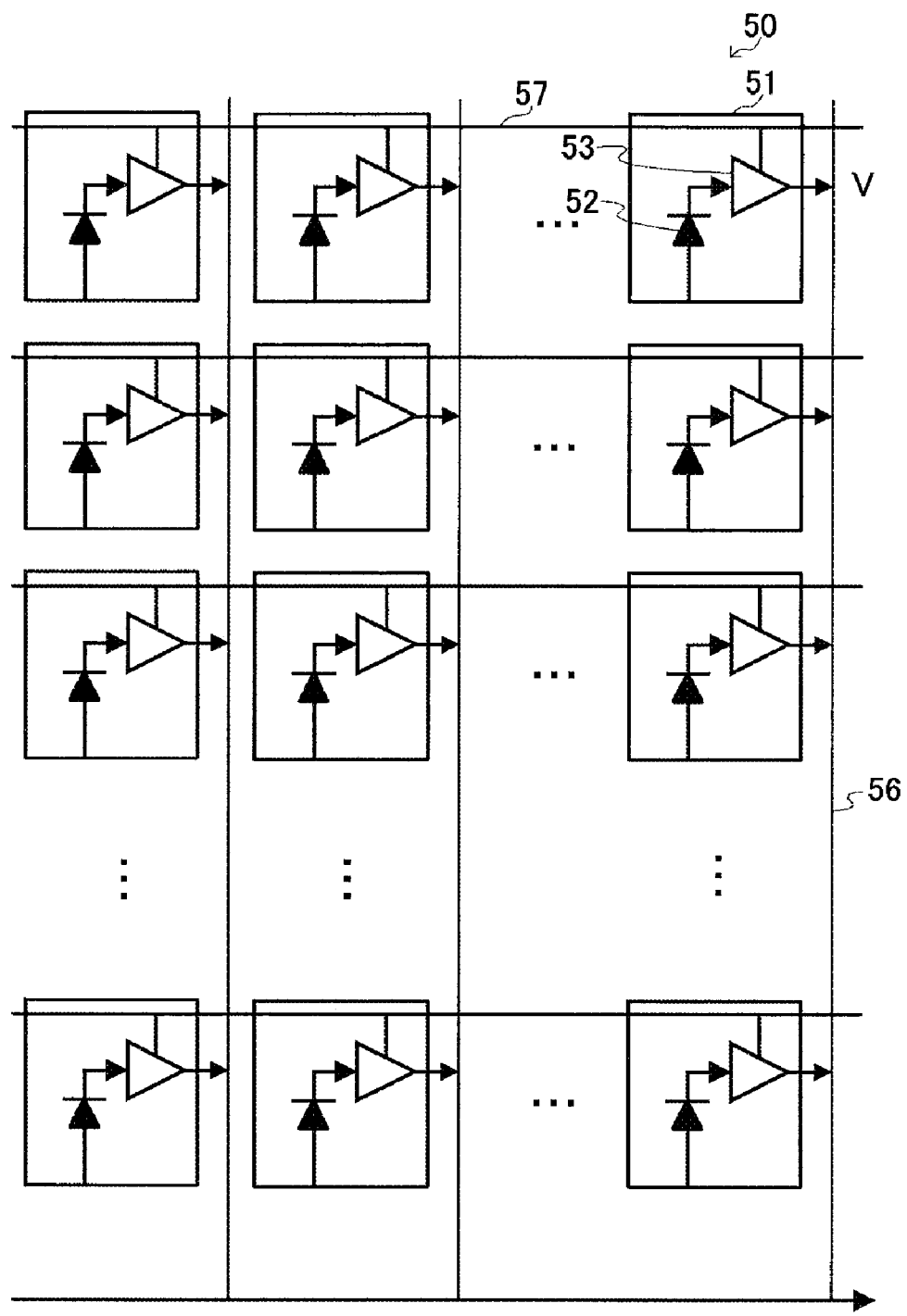
FIG. 5 shows a configuration example of an equivalent circuit using a CMOS active pixel sensor, according to Embodiment 4 of the present invention.
Figure 6:
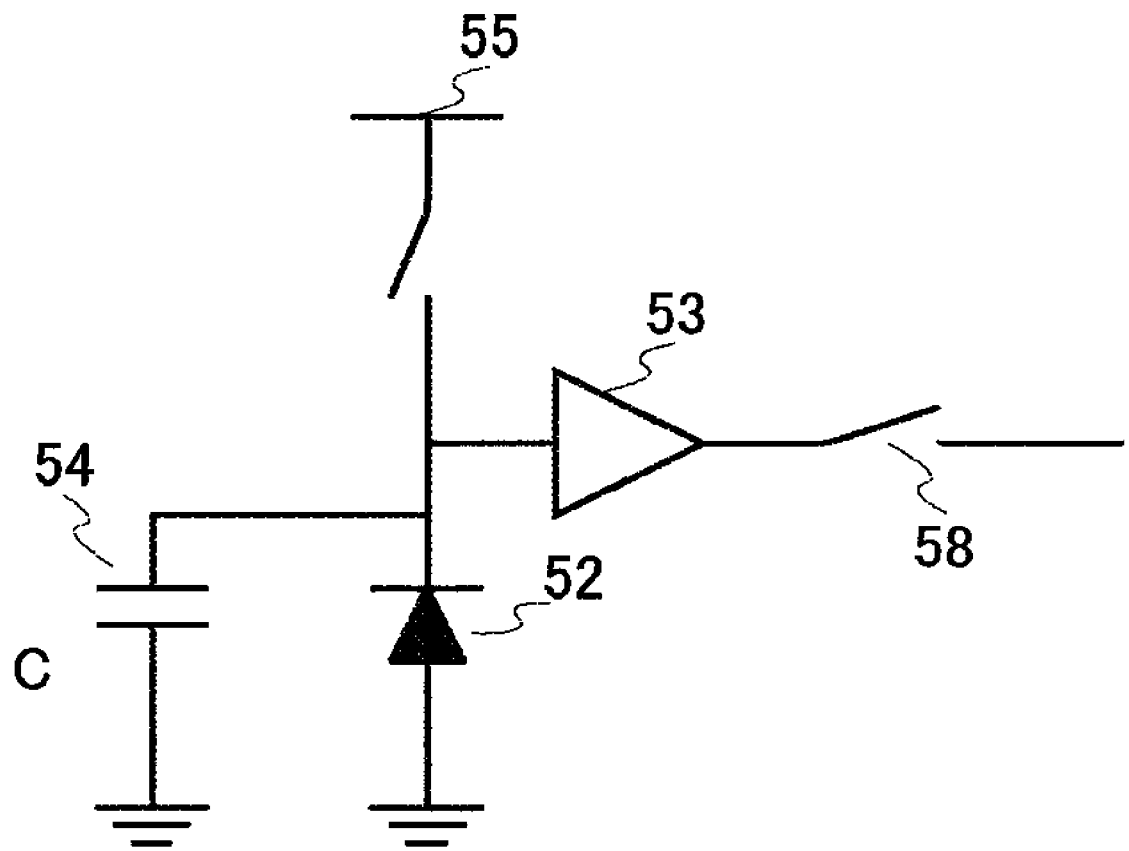
FIG. 6 shows a configuration example of an equivalent circuit corresponding to a unit cell, according to Embodiment 4 of the present invention.

Next, output correction in case where a CMOS active pixel sensor (hereinafter simply "CMOS sensor") is used as image sensor 10 will be explained with reference to FIG. 5 and FIG. 6. FIG. 5 shows a configuration example of an equivalent circuit using the CMOS sensor. FIG. 6 shows a configuration example of an equivalent circuit corresponding to a unit cell.

When CMOS sensor 50 shown in FIG. 5 is used as image sensor 10 shown in FIG. 1, light transmission section 18 is formed in CMOS sensor 50. In CMOS sensor 50, the amplification factor (the amount of correction) of the amplifier (corresponding to the "amplifying section" of the present invention) for each pixel is set such that the output from second photoelectric converting section 23 arranged in the location to meet light transmission section 18 shown in FIG. 1 is amplified more compared to the output from first photoelectric converting section 19 which has a light transmittance lower than in second photoelectric converting section 23. By this means, it is possible to provide a solution to the difference in representing part of the image from the portion to meet second photoelectric converting section 23 and part of the image from the portion to meet first photoelectric converting section 19.

As shown in FIG. 5, unit cell 51 shown in FIG. 5 is formed with photodiode 52, amplifier 53, capacitor 54 that accumulates electric charge in photodiode 52, reset switch 55 for discharging electric charge in capacitor 54 and selecting switch 58 for outputting the output from unit cell 51 to row signal line 56. Amplifier 53 converts electric charge into voltage and outputs the voltage. Selecting switch 58 operates by outputting a column selecting signal to column selecting line 57. In CMOS sensor 50, the amplification factor of amplifier 53 can be set per unit cell 51, so that a configuration is possible where the output from unit cell 51 in second photoelectric converting section 23 is amplified more compared to the output from unit cell 51 in first photoelectric converting section 19 which has a light transmittance lower than in second photoelectric converting section 23.

Such CMOS sensor 50 and phase difference detecting sensor 20 provided in the position to meet light transmission section 18 of CMOS sensor 50 form above imaging apparatus 1, 1*a* or 1*b*.

By mounting imaging apparatus 1, 1*a* or 1*b* which uses CMOS sensor 50 of the present embodiment on a camera, phase difference detecting sensor 20 is able to perform focus detection based on the phase difference detecting scheme while the subject image is maintained incident upon photoelectric converting section 12 (corresponding to photodiode 52), that is, while image sensor 10 (corresponding to CMOS sensor 50) is exposed to light. Further, accompanying this, (1) shooting images while image signals from image sensor 10 are displayed and (2) combining focus detection based on a phase difference detecting scheme and focus detection based on a contrast scheme, are possible. Further, CMOS sensors can be mass-produced and so are cheaper than CCD sensors having high voltage analog circuits, and have smaller elements and so consume less power.

<CCD Sensor>

Figure 7:
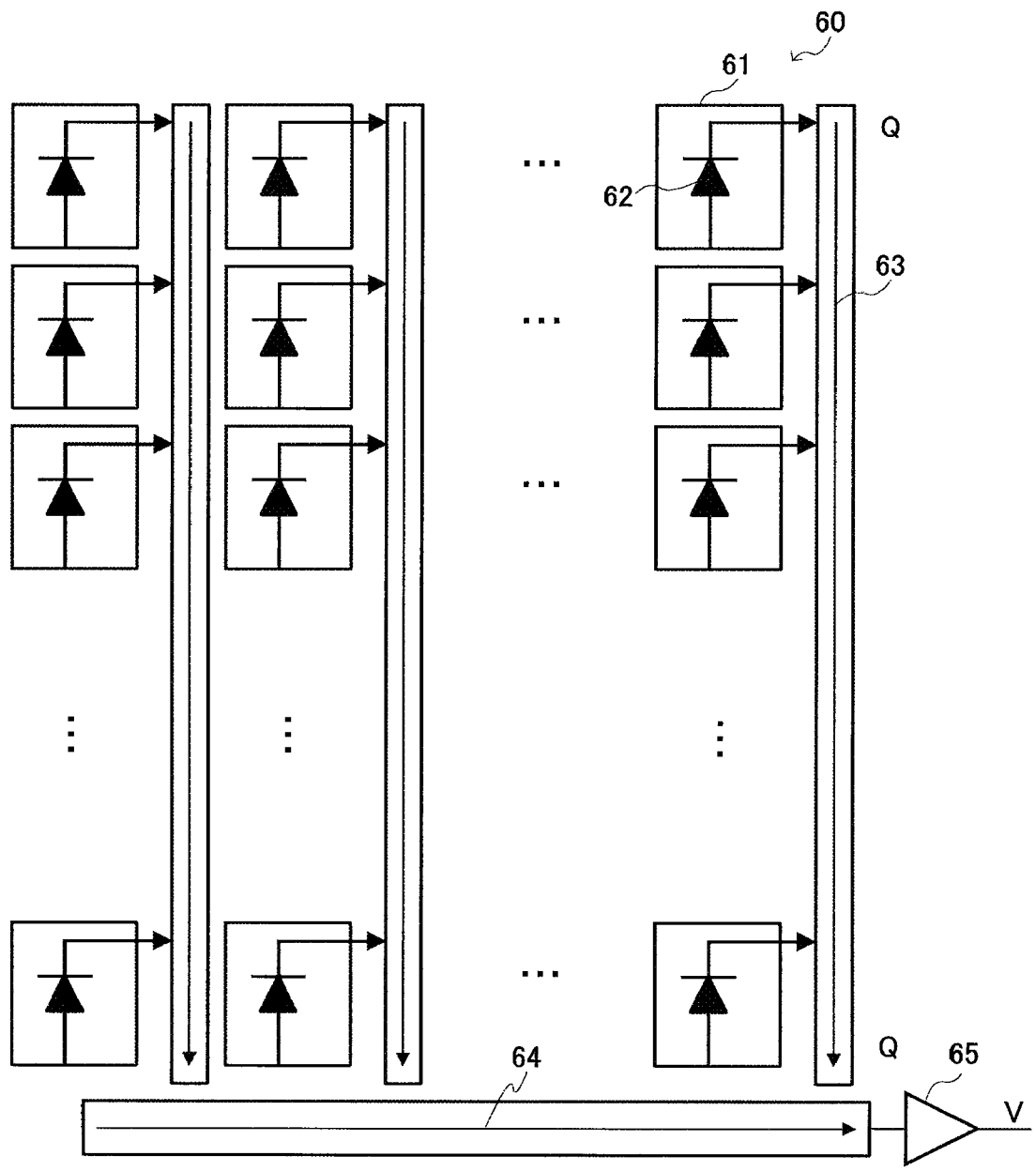
FIG. 7 shows a configuration example of an equivalent circuit using an interline transfer CCD, according to Embodiment 4 of the present invention.

Next, output correction in case where an interline transfer CCD (hereinafter simply "CCD sensor") is used as image sensor 10 will be explained with reference to FIG. 7. FIG. 7 shows a configuration example of an equivalent circuit using an interline transfer CCD.

When CCD sensor 60 shown in FIG. 7 is used as image sensor 10 shown in FIG. 1, light transmission section 18 is formed in CCD sensor 60. As explained above, it is preferable to carry out different processings for the output from second photoelectric converting section 23 of light transmission section 18 and the output from first photoelectric converting section 19 which has a light transmittance lower than in second photoelectric converting section 23.

On the other hand, CCD sensor 60 employs a configuration of aligning a plurality of unit cells 61 two-dimensionally. Unit cell 61 is formed with photodiode 62. Electric charge outputted from unit cell 61 is transferred to horizontal CCD 64 through vertical CCD 63. Amplifier 65 converts electric charge outputted from horizontal CCD 63 into voltage and outputs the voltage. In this way, if CCD sensor 60 is used, all unit cells 61 are amplified by same amplifier 65 and, therefore, with this configuration, the amplification factor in amplifier 65 cannot be set per unit cell 61. Consequently, changing the amplification factor in amplifier 65 per unit cell 61 makes the circuit configuration complex.

When CCD sensor 60 is used as image sensor 10 shown in FIG. 1, a signal processing section in a digital camera body preferably carries out different processings in FIG. 1 for the output from second photoelectric converting section 23 and the output from first photoelectric converting section 19 which has a light transmittance lower than in second photoelectric converting section 23. Here, "different processings" refers to processings of amplifying the output from second photoelectric converting section 23 arranged in the location to meet light transmission section 18 more, compared to the output from first photoelectric converting section 19. Further, "different processings" refers to processings of making equal the white balance and/or the brightness of images displayed based on the output from second photoelectric converting section 23 arranged in the location to meet light transmission section 18 and the output from first photoelectric converting section 19. By this means, it is possible to provide a solution to the difference in representing part of the image from the portion to meet second photoelectric converting section 23 and part of the image from the portion to meet first photoelectric converting section 19. Further, the signal processing section in the digital camera body will be explained below.

Embodiment 5

[A Summary of a Camera Using the Present Invention]

Figure 8:
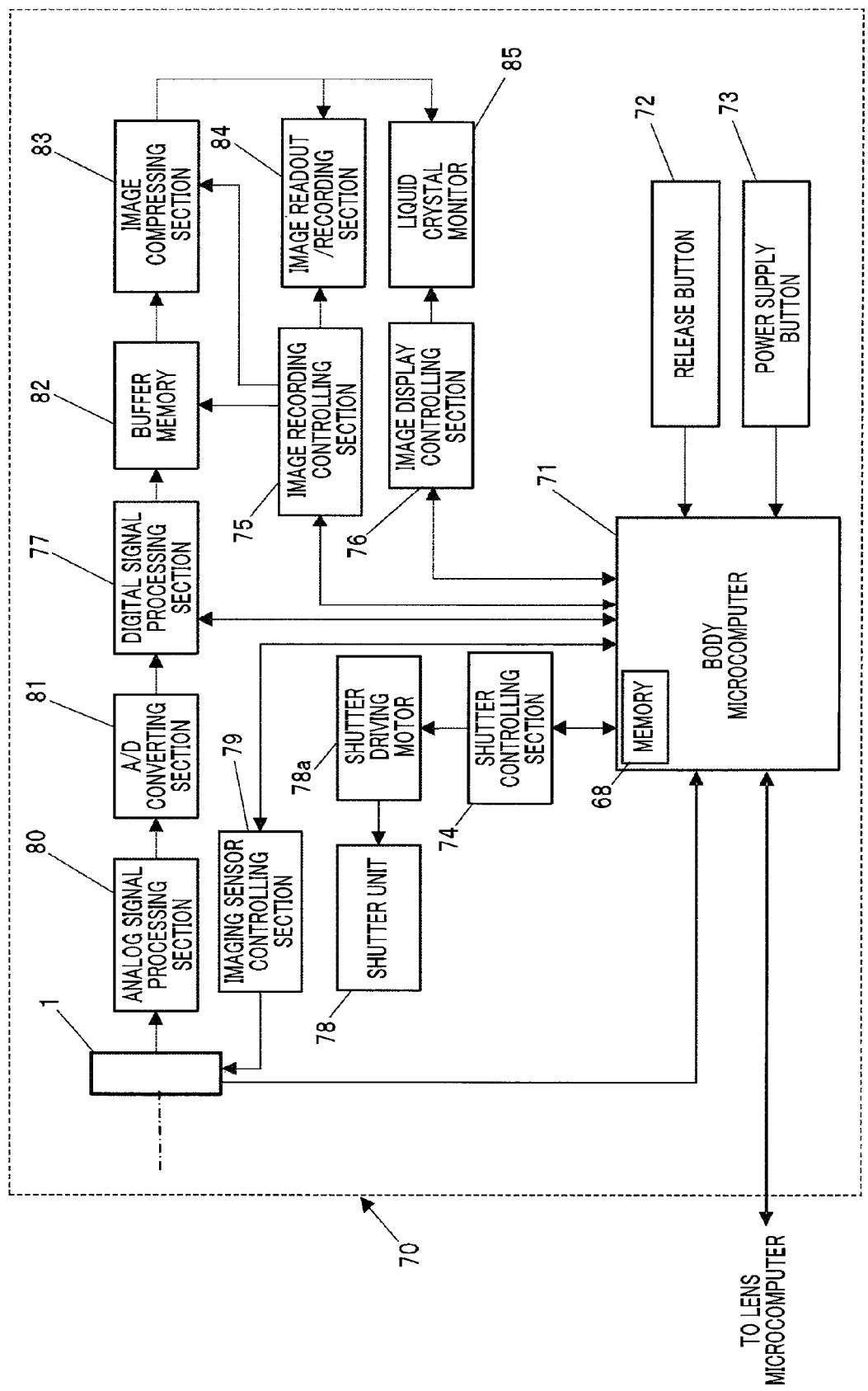
FIG. 8 is a block diagram showing a control system of a body of a camera according to Embodiment 5 of the present invention.

FIG. 8 is a block diagram showing a control system of a body of a camera (digital camera body) according to Embodiment 5 of the present invention. Digital camera body hereinafter simply "camera body") 70 having imaging apparatus 1 shown in, for example, FIG. 1 and FIG. 2 corresponding to imaging apparatus 1 in Embodiment 1, will be explained here with reference to FIG. 8. Imaging apparatus 1 has, for example, CCD sensor 60 (see FIG. 7) corresponding to image sensor 10 and phase difference detecting sensor 20. Further, processing carried out in camera body 70 for the output from image sensor 10 will be explained. Further, the processing explained below is applicable in case where CMOS sensor 50 (see FIG. 5 and FIG. 6) is used as image sensor 10.

Body microcomputer 71 is able to receive a signal from release button (shutter button) 72 of camera body 70. Power supply button 73 is a button for supplying power to body microcomputer 71 and camera body 70. Further, body microcomputer 71 is able to transmit a signal to shutter controlling section 74. Furthermore, body microcomputer 71 enables bi-directional communication between body microcomputer 71 and image recording controlling section 75, bi-directional communication between body microcomputer 71 and image display controlling section 76 and bi-directional communication between body microcomputer 71 and digital signal processing section 77. Further, body microcomputer 71 has memory 68 that stores a signal.

Shutter controlling section 74 drives shutter driving motor 78a to control shutter unit 78 based on the control signal from body microcomputer 71.

Release button 72 transmits information about the shutter timing, to body microcomputer 71.

As explained above, imaging apparatus 1 is formed with CCD sensor 60 (see FIG. 7) and phase difference detecting sensor 20. CCD sensor 60 converts an optical image formed by an imaging optical system of replaceable lens unit 100 (see FIG. 9 explained later), into an electrical image signal. CCD sensor 60 is controlled by imaging sensor controlling section 79 to be driven. The image signal outputted from CCD sensor 60 is processed in order in analog signal processing section 80, A/D (analog-to-digital) converting section 81, digital signal processing section 77, buffer memory 82 and image compressing section 83.

Phase difference detecting sensor 20 receives light having transmitted through CCD sensor 60, converts the light into an electrical signal for distance measurement and outputs the electrical signal. To be more specific, line sensor 22 outputs the electrical signal (image signal). The image signal outputted from line sensor 22 is processed in order in analog signal processing section 80, A/D converting section 81 and digital signal processing section 77. Then, the signal after processing is transmitted to body microcomputer 71, and microcomputer 71 calculates the defocus direction and the degree of defocus. Body microcomputer 71 transmits the calculated defocus direction and the calculated degree of defocus to a lens microcomputer (not shown) of replaceable lens unit 100. As a result, the focus lens of replaceable lens unit 100 is driven according to the command from the lens microcomputer to automatically adjust focus.

The image signal is transmitted from CCD sensor 60 to analog signal processing section 80. Analog signal processing section 80 carries out analog signal processing such as gamma processing for the image signal outputted from imaging apparatus 1. The image signal outputted from analog signal processing section 80 is transmitted to A/D converting section 81. A/D converting section 81 converts the analog image signal outputted from analog signal processing section 80, into a digital signal. The image signal outputted from A/D converting section 81 is transmitted to digital signal processing section 77.

Digital signal processing section 77 carries out digital signal processing such as noise cancellation and contour emphasis for the image signal converted into the digital signal by A/D converting section 81, and carries out different processings for the image signal corresponding to the electrical signal outputted from second photoelectric converting section 23 above light transmission section 18 and for the image signal corresponding to the electrical signal outputted from first photoelectric converting section 19. For example, the different processings include amplifying the level of the image signal corresponding to the electrical signal outputted from second photoelectric converting section 23. The pixels meeting light transmission section 18 and the image signals associated with the pixels can be specified. Therefore, the level of the image signal is amplified by preparing in advance a correction coefficient (the amount of correction) for compensating for the amount of light having transmitted and multiplying the value of the image signal with the correction coefficient.

Further, the output from third photoelectric converting section 24 located in the intermediate area between second photoelectric converting section 23 which is arranged in the location to meet light transmission section 18 and first photoelectric converting section 19 which has a lower light transmittance comparatively, is amplified stepwise. Third photoelectric converting section 24 is located on the side of the concave part shown in FIG. 1. The transmittance in the side of the concave part varies stepwise or successively. Accordingly, the amplification factors for the output from third photoelectric converting sections 24 located on the side of the concave part, is changed according to the transmittance. In this case also, the level of the image signal is amplified by preparing in advance a correction coefficient and multiplying the value of the image signal with the correction coefficient. In case where entire image sensor 10 is formed with photoelectric converting sections of a high transmittance, the levels of image signals may be amplified by preparing one correction coefficient in advance and amplifying the values of all image signals using the correction coefficient. Further, digital signal processing section 77 is one example of the signal processing section of the present invention.

Further, digital signal processing section 77 finds the contrast value from the corrected image signal and reports the contrast value to body microcomputer 71. It naturally follows that focus may be adjusted only based on a phase difference detecting scheme using phase difference detecting sensor 20. However, it may be possible to combine this phase difference detecting scheme with a video AF scheme based on a so-called contrast scheme for finding a contrast value following driving of the focus lens and finding a contrast peak to control the focus lens. Consequently, by mounting imaging apparatus 1, it is possible to provide a camera that functions precise video AF for detecting contrast at imaging apparatus 1 and that functions phase difference AF for enabling high speed focus adjustment by defocus detection.

The image signal outputted from digital signal processing section 77 is transmitted to buffer memory 82. Buffer memory 82 stores the image signal processed by digital signal processing section 77 on a temporary basis. Buffer memory 82 is formed with a RAM (Random Access Memory) and the like.

The image signal outputted from buffer memory 82 is transmitted to image compressing section 83 according to the command from image recording controlling section 75. Image compressing section 83 carries out compression processing for the image signal according to the command from image recording controlling section 75. As a result of this compression processing, the image signal is compressed to a smaller data size than the original data. For example, JPEG (Joint Photographic Experts Group) is used for this compression scheme.

The compressed image signal is transmitted from image compressing section 83 to image readout/recording section 84 and liquid crystal monitor 85. With the present embodiment, displaying images in liquid crystal monitor 85 is possible while phase difference detecting sensor 20 is operated, so that phase difference detection and live-viewing are possible at the same time. On the other hand, body microcomputer 71 transmits control signals to image recording controlling section 75 and image display controlling section 76 respectively. Image recording controlling section 75 controls image readout/recording section 84 based on the control signal from body microcomputer 71. Image display controlling section 76 controls liquid crystal monitor 85 based on the control signal from body microcomputer 71.

Image readout/recording section 84 stores an image signal in an internal memory and/or a removable memory according to the command from image recording controlling section 75. Information that must be stored with an image signal includes the date the image is shot, focus distance information, shutter speed information, aperture value information and shooting mode information.

Liquid crystal monitor 85 displays the image signal as a visible image according to the command from image display controlling section 76. Liquid crystal monitor 85 displays information that must be displayed with an image signal, according to the command from image display controlling section 76. Information that must be displayed with an image signal includes focus distance information, shutter speed information, aperture value information, shooting mode information and focus state information. Liquid crystal monitor 85 is an example of the display section.

Further, liquid crystal monitor 85 displays a setting screen that must be set by the photographer in predetermined shooting/playback mode, according to the command from image display controlling section 75.

When the photographer turns on power supply button 73 and selects shooting mode to shoot an image, the power supply of the camera body turns on and liquid crystal monitor 85 displays as a visible image an optical image of a subject converted by imaging apparatus 1 into an electrical image signal, according to the command of image display controlling section 76.

Body microcomputer 71 outputs a signal for driving the focus lens, to the lens microcomputer.

Figure 9:
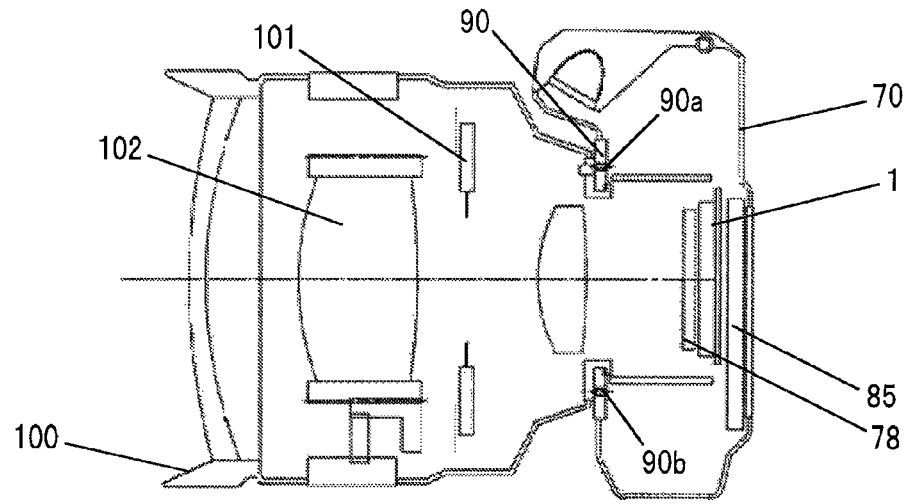
FIG. 9 shows a schematic configuration of a digital camera with a replaceable lens which mounts the imaging apparatus according to Embodiment 1 of the present invention.

A summary of the camera adopting the present invention will be explained here using FIG. 9. FIG. 9 shows a schematic configuration of a digital camera with a replaceable lens which mounts the imaging apparatus according to Embodiment 1 of the present invention. In FIG. 9, the components explained in FIG. 8 will be assigned the same reference numerals.

Replaceable lens unit 100 is detachable from camera body 70. In camera body 70, mirrors need not to be inserted in the optical path between replaceable lens unit 100 and imaging apparatus 1 (image sensor 10) as in conventional cameras. Further, the finder function for deciding the frame can use live-viewing. That is, the subject image can be observed by displaying the subject image received in imaging apparatus 1 on liquid crystal monitor 85 provided in the back of the body. Shutter unit 78 opens when release button 72 of camera body 70 is turned on and guides the subject image to imaging apparatus 1.

Body mount 90 is provided with electrical contact 90a that enables power supply and electrical communication with replaceable lens unit 100. Further, body mount 90 is provided with real time communication terminal 90b that enables communication, such that an actuator that requires feedback control from the body can be used as a focus adjustment driving actuator and driving of an aperture (iris) can be controlled from the body side when shooting moving images.

Next, the actual shooting operation will be explained. When power supply button 73 is turned on, iris 101 and shutter unit 78 open and power is supplied to imaging apparatus 1. Then, liquid crystal monitor 85 displays the image signal outputted from imaging apparatus 1 as a live-view image. Upon so-called half-press, that is, when release button 72 is pressed halfway, S1 switch (not shown) is turned on, and body microcomputer 71 calculates the defocus direction and the degree of defocus using phase difference detecting sensor 20 built in imaging apparatus 1 and transmits calculated data to the lens microcomputer in replaceable lens unit 100 through real time communication terminal 90b. As a result, focus lens 102 is driven according to the command from the lens microcomputer and the focus adjustment operation of focus lens 102 based on the phase difference detecting scheme is finished.

When the auto focus function based on the contrast scheme is combined, the focus adjustment operation is finished by calculating a contrast value based on an image signal at predetermined intervals from a predetermined distance before focus lens 102 reaches the target position designated by the lens microcomputer according to the phase difference detecting scheme, driving focus lens 102 near the target position and stopping focus lens 102 in the position where the contrast value reaches a peak.

During the focus adjustment operation based on the phase difference detecting scheme, liquid crystal monitor 85 displays an image signal outputted from imaging apparatus 1.

Further, upon so-called full-press, that is, when release button 72 is fully pressed, S2 switch (not shown) is turned on, and the shooting operation starts by closing shutter unit 78 and narrowing down iris 101 to an aperture value derived from the metering result in imaging apparatus 1.

With the camera according to the present embodiment, phase difference detecting sensor 20 enables focus detection based on the phase difference detecting scheme while the subject is maintained incident upon photoelectrical converting section 12, that is, while image sensor 10 is exposed to light. Further, accompanying this, (1) utilizing a high speed auto focus function based on a phase difference detection scheme is possible while image signals from image sensor 10 are displayed and (2) by combining focus detection based on a phase difference detecting scheme and focus detection based on a contrast scheme, it is possible to realize a high speed, precise auto focus function. Further, by removing mirrors, it is possible to eliminate the time to drive the mirrors and reduce the release time lag. Furthermore, by removing the mirrors, miniaturization is possible.

Still further, phase difference detecting sensor 20 is built in imaging apparatus 1, and, consequently, the relative positions between the image plane of image sensor 10 and phase difference detecting sensor 20 can be adjusted precisely, so that it is possible to provide very precise defocus detection capability.

[A Summary of a Conventional Single-Lens Reflex System]

Figure 10:
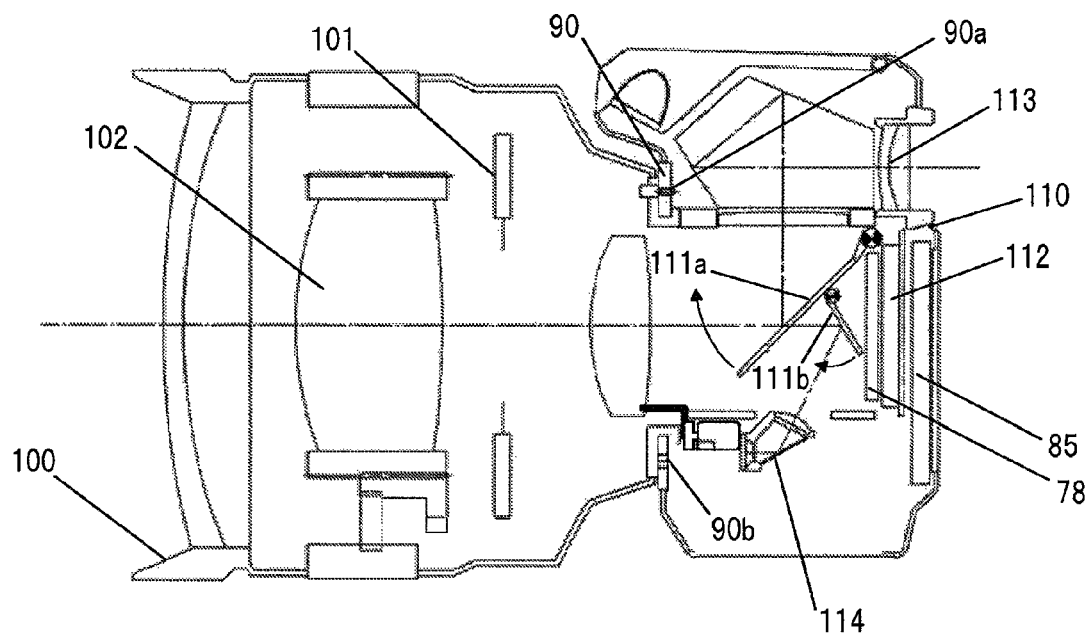
FIG. 10 shows a schematic configuration of a conventional single-lens reflex camera.

A summary of a conventional single-lens reflex camera driving system will be explained here using FIG. 10. FIG. 10 shows a schematic configuration of a conventional single reflex camera. In FIG. 10, the same components as in FIG. 9 will be assigned the same reference numerals.

In conventional single-lens reflex camera body 110 shown in FIG. 10, when the power supply is turned on, main mirror 111a and sub mirror 111b stand by in the state shown in FIG. 10 and shutter unit 78 closes, so that electric charge in image sensor 112 can be discharged. When the photographer looks into finder eye piece 113, determines the composition and presses the release button (not shown) halfway, power is supplied to each electrical circuit in single-lens reflex camera body 110 and each electrical circuit in replaceable lens unit 100. Then, exposure is calculated based on data metered by a metering element in phase difference detecting unit 114 to determine the control shutter speed of shutter unit 78 and the aperture value of iris 101 in replaceable lens unit 100 according to shooting mode. At the same time, by detecting the focused state according to the output from phase difference detecting unit 114, the degree of driving focus lens 102 in replaceable lens unit 100 is calculated and the focus adjustment driving system starts being driven.

Further, when the release button is fully pressed, main mirror 111a and sub mirror 111b look up in the directions shown by the arrows in FIG. 10, iris 101 in replaceable lens unit 100 is, at the same time, driven by the aperture driving system and is set to a predetermined aperture value. When the preparation for shooting images is finished, electric charge in image sensor 112 is discharged and shutter unit 78 starts predetermined exposure. When exposure is finished, main mirror 111a and sub mirror 111b are brought back into the states shown in FIG. 10, all functions are reset and a series of shooting operations are finished.

The above imaging apparatus can provide a function for enabling high speed focus detection while exposing the image sensor to light. Consequently, the imaging apparatus with the above focus detection function can be utilized in all cameras such as so-called compact digital cameras and digital cameras with replaceable lenses. Further, by combining video AF and removing mirrors, it is also possible to create small digital cameras of a new kind with a high speed, precise auto focus function.

What is claimed is:

1. An imaging apparatus comprising:
an image sensor that comprises a photoelectric converting section; and
a phase difference detecting sensor that detects a phase difference, wherein:
at least part of the image sensor is formed with a light passing section;
the photoelectric converting section comprises a substrate;
the light passing section comprises a thin part formed in the substrate; and
the phase difference detecting sensor is arranged in a location to meet the light passing section and receives light passed through the image sensor and detects the phase difference.

2. The imaging apparatus according to claim 1, wherein the thin part has a thickness allowing light to pass.

3. The imaging apparatus according to claim 1, wherein the thin part comprises a concave part formed in the substrate.

4. The imaging apparatus according to claim 3, wherein the concave part is formed by cutting, grinding or etching the substrate.

5. The imaging apparatus according to claim 3, wherein sides of the concave part are formed at such angles that the passed light does not reflect upon the phase difference detecting sensor.

6. The imaging apparatus according to claim 1, comprising a plurality of phase difference detecting sensors.

7. The imaging apparatus according to claim 1, wherein:
the photoelectric converting section comprises:
a first photoelectric converting section; and
a second photoelectric converting section which is formed in the light passing section and which comprises a light transmittance higher than in the first photoelectric converting section; and
an output from the second photoelectric converting section is amplified more compared to an output from the first photoelectric converting section.

8. The imaging apparatus according to claim 7, wherein:
the photoelectric converting section comprises a third photoelectric converting section located in an intermediate area between the first photoelectric converting section and the second photoelectric converting section; and
an output from the third photoelectric converting section is amplified stepwise.

9. A camera having an imaging apparatus and a signal processing section, wherein:
the imaging apparatus comprises:
an image sensor that comprises a photoelectric converting section which comprises:
a first photoelectric converting section; and
a second photoelectric converting section which comprises a light transmittance higher than in the first photoelectric converting section;
a phase difference detecting sensor that receives light passed through the image sensor and detects a phase difference; and
the signal processing section carries out different processings for an output from the second photoelectric converting section and for an output from the first photoelectric converting section, further wherein:
at least part of the image sensor is formed with a light passing section;
the first photoelectric converting section and the second photoelectric converting section comprise a substrate;
the light passing section comprises a thin part formed in the substrate;
the second photoelectric converting section is formed in the light passing section; and
the phase difference detecting sensor is arranged in a location to meet the light passing section.

10. The camera according to claim 9, wherein the signal processing section amplifies the output from the second photoelectric converting section more compared to the output from the first photoelectric converting section.

11. The camera according to claim 9, wherein the signal processing section amplifies stepwise an output from a photoelectric converting section located in an intermediate area between the second photoelectric converting section and the first photoelectric converting section.

12. The camera according to claim 9, wherein the signal processing section carries out processing for making equal at least one of a white balance and a brightness of images displayed based on the output from the second photoelectric converting section and the output from the first photoelectric converting section.

13. A camera comprising:
an image sensor that comprises a photoelectric converting section comprising an amplifying section; and
a phase difference detecting sensor that detects a phase difference, wherein:
at least part of the image sensor is formed with a light passing section;
the photoelectric converting section comprises a substrate;
the light passing section comprises a thin part formed in the substrate; and
the phase difference detecting sensor is arranged in a location to meet the light passing section and receives light passed through the image sensor and detects the phase difference.

* * * * *